(12) United States Patent
Mozel et al.

(10) Patent No.: US 7,439,285 B2
(45) Date of Patent: Oct. 21, 2008

(54) LIQUID THERMOSETTING INK

(75) Inventors: Jacob Mozel, Kfar Saba (IL); Izhar Halahmi, Hod Hasharon (IL); Ran Vilk, Kiron (IL)

(73) Assignee: Printar Ltd., Rehovot (IL)

( * ) Notice: Subject to any disclaimer, the term of this patent is extended or adjusted under 35 U.S.C. 154(b) by 178 days.

(21) Appl. No.: 10/762,515

(22) Filed: Jan. 23, 2004

(65) Prior Publication Data

US 2005/0165135 A1 Jul. 28, 2005

(51) Int. Cl.
*C08L 63/00* (2006.01)
*C09D 11/02* (2006.01)
*C09D 11/10* (2006.01)

(52) U.S. Cl. ............... 523/440; 523/457; 106/31.33; 106/31.57; 106/31.58; 106/31.65; 106/31.85; 106/31.86

(58) Field of Classification Search .......... None
See application file for complete search history.

(56) References Cited

U.S. PATENT DOCUMENTS

| | | | |
|---|---|---|---|
| 5,478,885 A | * | 12/1995 | Masse et al. ............ 525/92 H |
| 5,480,957 A | * | 1/1996 | Muroi et al. ............ 528/87 |
| 6,210,862 B1 | | 4/2001 | Day et al. |
| 6,319,652 B1 | | 11/2001 | Akutsu et al. |
| 2002/0077384 A1 | * | 6/2002 | Sano et al. ............ 523/160 |
| 2003/0236321 A1 | * | 12/2003 | Sano et al. ............ 523/160 |
| 2004/0048950 A1 | * | 3/2004 | Nishida et al. ............ 523/160 |
| 2004/0113961 A1 | * | 6/2004 | Ishikawa ............ 347/11 |
| 2005/0161633 A1 | * | 7/2005 | Halahmi et al. ............ 252/182.13 |
| 2006/0047014 A1 | * | 3/2006 | Hopper et al. ............ 523/160 |

FOREIGN PATENT DOCUMENTS

JP         63-261253         * 10/1988

OTHER PUBLICATIONS

Derwent abstract of JP 63-261253.*

* cited by examiner

*Primary Examiner*—Michael J Feely
(74) *Attorney, Agent, or Firm*—The Nath Law Group; Susanne M. Hopkins; Ari G. Zytcer

(57) ABSTRACT

Liquid thermosetting ink for ink-jet applications includes at least a resin, at least one solid latent curing agent having a maximal particle size of less than 2 microns and an inert filler having fine particles. The single-pack or two-pack ink has a viscosity lower than 50 Cp at the application temperature, a surface tension lower than 80 dyn/cm at the application temperature, and a glass transition temperature of cured ink of greater than 120° C.

12 Claims, No Drawings

LIQUID THERMOSETTING INK

FIELD OF INVENTION

The present invention generally relates to the filed of liquid thermosetting inks useful for ink-jet applications, such as industrial solder masks and to a method for producing the same.

BACKGROUND OF THE INVENTION

Solder masks (SM) and photoimagable solder masks (PISM) are a permanent coating for a printed circuit board (PCB) that do not cover certain parts of the circuitry on the board such as the contact points (pads). Two component UV curing acrylates and epoxy-acrylate PSMs are traditionally employed by at least two subsequent steps (i) covering the PCB totally; and (ii) applying various photolithographic techniques to revealing underlined structures on the board while masking other, so that the solder may be applied to the exposed structures. This intricate process has many drawbacks such as requirement for many process steps before final curing, exposure of the board to aggressive developers, contamination throughout the PCB's holes, frequent damage to embedded components, obligation to utilize pollutant solutions that need expensive de-toxification and capital consuming equipment. Moreover, the long-term properties of the cured film are scarified for developability, which calls for water or solvent solubility.

Those drawbacks and other may be prevented by digital application of the solder mask specifically to the targeted portions of the PCB. The most efficient method to do that is by ink-jet technology. Nevertheless, such machinery is by any means limited to liquid ink which is obligatorily characterized by a surface tension lower than 50 dyn/cm at application temperature; viscosity of less than 80 Cp at application temperature; incomparable stability which avoids sedimentation and segregation during storage and jetting; one pack system, wherein the viscosity changes less than 10% within long periods of time, say at least 1 month; very fast development of viscosity after deposition of drop, to keep highest resolution; contains minimal content of volatile matter, usually less than 25% etc. A commercial SM is further characterized by a suitable physical, chemical and mechanical properties to withstand presence of solder, fluxes, organic and inorganic cleaners without any significant deterioration while maintaining its coverage over the portions of the board wherein solder or conductor or glass-epoxy substrate is to be masked, such as required at the IPC SM840-B specifications. The covered board should have at least the same flammability resistance as the original board, according to UL94 V0 specification. Most SMs contains halogenated fire retardants to meet this requirement. Due to environmental regulation it is highly recommended to meet the UL94 without having halogens in the SM.

The chemical and physical resistance of commercially available SMs is correlated to high Tg values, which reflects the high density of the cross-linking and the rigidity of the molecular backbone due to high content of aromatic or heterocyclic structures. The mask should remain flexible enough to withstand mechanical stresses without cracking or peeling and thus to outlast in ever changing environments. In order to meet this difficult trade-off, high molecular weight resins are required, usually having viscosity at ambient temperature, between 5,000 to 100,000 Cp. The chemical resistance of industrial solder masks is mostly achieved by epoxy resins and their curatives comprising respectively high content of aromatic, heterocyclic or cyclo-aliphatic ingredients. For lower end boards, acrylic-based solder mask are applicable, but they are inferior in all respects relatively to the commercially available epoxy-based resins.

Epoxy-based SMs are cost-effective matrices known of their excellent chemical and thermal properties; improved adhesion to metals, ceramics and plastics; ease of application; low toxicity; and comprised a wide spectrum of resins, diluents, modifiers and curing agents. The most popular epoxy resins for high performance applications are diglycidyl ethers of bisphenol A (hereinafter 'DGEBA'), epoxy phenol novolacs (hereinafter 'EPN'), epoxy cresol novolacs (hereinafter 'ECN'), diglycidyl ethers of bisphenol F (hereinafter 'DGEBF'), commercially available bisphenol A based novolacs products or any mixture thereof.

Epoxy resins are cured by various compositions, such as amines, acids and anhydrides, mercaptans, sulfide and Lewis acids and inorganic salts. Most of the aforementioned curing agents react with the resin at ambient temperature, thus applicable only in two-pack systems, and have a significantly limited pot life.

Latent curatives are practically inactive hardeners until triggered by effective irradiation or heat means. One potential latent system is based on UV-initiated cationic initiators that supply the required Lewis acid to an epoxy system. Hence, U.S. Pat. No. 6,319,652 to Akutsu et al. discloses a energy beam curable epoxy resin composition, essential including cationic polymerizing organic substance; sensitive initiator; organic substance, radically polymerizing organic compound, and radical polymerization initiator. Similarly, U.S. Pat. No. 6,210,862 to Day et al. teaches a very complicated non-brominated epoxy composition for use as solder mask consisting of two systems: (a) epoxy resin having a polyol resin which is a condensation product of epichlorohydrin and bisphenol A; epoxidized multifunctional bisphenol A formaldehyde novolak resin and a solid epoxidized glycidyl ether of bisphenol A; and (b) a photoinitiator capable of initiating polymerization upon exposure to actinic radiation. Unfortunately, these epoxy-base solder masks are expensive, toxic, very sensitive to humidity and contaminations, and can utilize merely narrow spectrum of raw materials, thus limited for practical mass production applications. They have also limit of penetration of light and always requires extra heat post curing for cure completion and thermal relaxation.

Another family of latent curative is based on fine solid curative matrices that are only partially soluble in the epoxy resins at ambient temperature, however, after being melted in the polymer their solubility is increasing and the polymerization is initiate thereon. These curative compounds are usually selected from modified amines, such as the commercially available AJICURE product by Ajinomoto and ANCAMINE 2441 and 2442 by Air Products; imidazoles such as the CUREZOL commercially available by Air Products; dicyandiamide (DICY) such as the AMICURE CG-1400 commercially available by Air Products; urea derivatives; inorganic compounds such as $BF_3$ and $BCl_3$ salts like the LeeCure commercially available catalyst by Leepoxy plastics Inc. In the presence of solvents or low molecular weight co-monomers, which is especially crucial for ink-jet applications, modified amines, imidazoles, $BCl_3$ and $BF_3$ and urea derivatives has some reactivity at ambient temperature, causing the viscosity to increase. Thus those curative compositions are less applicative in mass industrial utilizations but may be used in small-volume applications, where pot life of less than one week is allowed.

DICY has lowest solubility and once having size reduced to less than 2 microns, it becomes very effective latent curing agent for ink jettable epoxy, even when the ink contains solvents and monomers, such as acrylic and methacrylic compositions. DICY cures epoxy to very high Tg values and much alike aromatic amines and anhydride curing agents, it is characterized by excellent chemical and physical properties suitable for solder masks. DICY is a commercially available pulverized powder. The finest powders available are having an average particle size of are of 6 microns and thus excluded from ink jet inks. In order to be applied by ink-jet, DICY should be manipulated to maximal particle size of less than 2 micron, and more preferably less than 700 nanometers, wherein its particles are stable in a manner that their aggregation or agglomeration is avoided.

SUMMARY OF THE INVENTION

The one objective of the present invention to enable printing of high performance thermosetting compound by ink-jet onto PCBs, without scarifying the requirements from the cured layer, as such as described by IPC SM840-B specifications.

It is hence according to one embodiment of the present invention to provide a novel liquid thermosetting ink for ink-jet applications, comprising one resin or more; at least one solid latent curing agent characterized by a maximal particle size of less than 2 microns; and an inert filler having fine particles; wherein said single-pack or two-pack ink is characterized inter alia by a viscosity lower 50 Cp at application temperature, surface tension lower 80 dyn/cm at application temperature, and glass transition temperature of cured ink of greater than 120° C.

It is further according to yet another fundamental embodiment of the present invention to provide a cost effective liquid thermosetting epoxy-based ink as defined above, wherein at least a portion of the resin ingredients is an epoxy-based resin. This ink is characterized inter alia by a viscosity, which is lower 20 Cp at application temperature; surface tension ranging from 24 to 34 dyn/cm at application temperature, and glass transition temperature of cured ink of greater than 120° C. More specifically, said ink is adapted for solder mask applications; for bonding devices or components in the electronic manufacturing; for passive component printing electronic manufacturing, capacitors and/or resistors; and/or for conductive lines and features printing electronic manufacturing, lines, pads and/or bumps.

It is further according to another fundamental embodiment of the present invention to provide the aforementioned ink, wherein the curing agent is selected from compositions containing modified amines, urea derivatives, imidazoles, dicyandiamide or any mixture thereof; and/or wherein the major portion of the epoxy comprising polymers selected from group containing aromatic, heterocyclic, cycloaliphatic ring and at least two oxirane (epoxy) groups, for example DGEBA, EPN, ECN, DGEBF, commercially available bisphenol A based novolac products or any combination thereof.

It is according to another fundamental embodiment of the present invention wherein the ink is additionally comprised of reactive diluents like monoepoxides; and especially those that are selected from aromatic, heterocyclic, and/or cycloaliphatic compositions. The ink may also comprising impact modifiers and/or flexibilizers having rubbery moieties or blocks in their chain, and especially those that are selected from amines; epoxies; hydroxy terminated rubbers; rubber-like compositions comprising polybutadienes, polyisoprenes, polysulfides, polyurethanes, hydrogenetaed polybutadienes and/or polyisoprenes, ethylene-propylene copolymers, soft polyacrylate esters, polydimethyl siloxane elastomers; or any mixture thereof. The ink may also comprising adhesion promoters; and especially those that are selected from siloxane, zirconate, titanate, aluminate or any mixture thereof.

It is according to another embodiment of the present invention wherein the ink is comprised of curing agents are activated by means of an effective actinic irradiation. This ink may be comprised of monomers and/or oligomers that are selected from styrene, acrylic, methacrylic acid and esters thereof; acrylated or methacrylated epoxies; acrylated or methacrylated urethanes; or any mixture thereof; and may be additionally comprised of photoinitiators and secondary thermal initiators adapted to initiate and cure unsaturated ingredients.

This ink, defined in any of the above, may additionally comprising amino resins characterized by an impart adhesion and/or high cross-link density selected from melamine-based resins, urea resins, benzoguanamine resins or any mixture thereof.

It is according to another embodiment of the present invention to provide non-halogenated flame retardant ink that meets the UL 94 V0 requirements.

Moreover, the hereto-defined ink may be additionally comprised of mineral fillers, having maximal particle size of 2 micron in final concentration ranges between 1 to 30% by weight. More specifically, those mineral fillers are may further characterized by a maximal particle size of about 300 nm.

It is according to another embodiment of the present invention to provide an ink as defined in any of the above additionally comprising additives selected from surface active agents and/or colloid stabilizers; rheology modifiers; pigments and dyes; matting agents; solvents; co-solvents; diluents and mixture thereof. More specifically, the aforementioned solvents; co-solvents or diluents may be at least partially volatile or unsaturated.

It is another object of the present invention to provide an industrially applicable method for producing liquid thermosetting ink for ink-jet applications. This novel method is inter alia comprised of the following steps: (a) dissolving at least one solid latent curing agent characterized by fine particles in a solvent to form a clear solution; (b) admixing an inert filler having maximal particle size of 2 microns with the solution obtained above to form a homogenized dispersion; (c) precipitating said curing agent as a layer or in the form of small crystals onto said filler surface and/or inside the internal porosity of said filler; (d) evaporating said solvent; (e) drying or concentrating the same; and then (f) admixing a predetermined measure of ink composition. This genuine method is provided for either one-pack or two-pack ink characterized by a viscosity lower 50 Cp at application temperature, surface tension lower 80 dyn/cm at application temperature, and glass transition temperature of cured ink of greater than 120° C. is obtained.

It is according to one embodiment of the present invention wherein the curing agent is admixed up to a measure that curing agent to filler weight ratio is ranges 0.01:100 to 50:100 respectively. It is also in the scope of the present invention wherein an additional step is provided, comprising evaporating the solvent by means known in the art, selected in a non limiting manner from introducing of at least one another solvent to the said admixture; changing the temperature; pH shifting; altering electrolytes concentration or any combination thereof. Additionally or alternatively, this method may be also comprised of the step of stabilizing the obtained slurry by means of admixing a sufficient measure of dispersing agents and/or rheology modifiers. It is acknowledged in this respect that according to yet another embodiment of the present invention, the obtained latent curing agent is admixed up to a measure that curing agent to ink weight ratio is ranges form 1 to 15% from the epoxy resins w/w. respectively; and/or wherein the one-pack or two-pack ink is adapted for solder masks, electronic components, or adhesives applications.

It is according to yet another embodiment of the present invention wherein the abovementioned method is inter alia comprised of the following steps: (a) dissolving particles of at least one solid latent curing agent or its precursors in a solvent to form a clear solution; (b) admixing an inert filler having maximal particle size of 2 microns with the solution obtained above to form a homogenized dispersion; (c) precipitating said curing agent as a layer or in the form of small crystals onto said filler surface and/or inside the internal porosity of said filler; (d) evaporating said solvent; (e) drying or concentrating the same; and then (f) admixing a predetermined measure of epoxy-based resin. This method is provided for either one-pack or two-pack ink characterized by a viscosity which lower 20 Cp at application temperature; surface tension ranging from 24 to 34 dyn/cm at application temperature, and glass transition temperature of cured ink of greater than 120° C. is obtained. It is acknowledged in this respect that according to yet another embodiment of the present invention, the obtained latent curing agent is admixed up to a measure that curing agent to ink weight ratio is ranges form 1 to 15% from the epoxy resins w/w respectively; and/or wherein the one-pack or two-pack ink is adapted for solder masks, electronic components, or adhesives applications.

DETAILED DESCRIPTION OF THE INVENTION

The following description is provided, alongside all chapters of the present invention, so as to enable any person skilled in the art to make use of said invention and sets forth the best modes contemplated by the inventor of carrying out this invention. Various modifications, however, will remain apparent to those skilled in the art, since the generic principles of the present invention have been defined specifically to provide liquid thermosetting ink for ink-jet applications in the various electronic technologies and to a method for producing said ink.

It is in the scope of the present invention wherein the aforementioned term "electronic technologies" is referring to any electronic and/or microelectronic and/or optical components or devices manufacturing processes suitable to be applied by ink jet technology. More specifically, the electronic technologies according to the present invention are selected from solder masks, dielectrics, resistors, optical waveguides, conductive modules, capacitance layers, adhesives, protective coatings, encapsulants or any combination thereof.

It is further in the scope of the present inventor wherein the term "one-pack ink" is referring to any ink comprising a curing agent distributed at the same liquid medium with the resin.

It is further in the scope of the present inventor wherein the term "latent curing agent" is refereeing to any insoluble low molecular weight chemicals that are dispersed in monomers, oligomers and polymers or their mixtures. Those components are practically inactive at ambient temperature and become active at elevated temperatures. When activated, the dispersed insoluble particles of latent curing agent dissolve and react or initiate polymerization with polymers to form a cross-linked, and thus hardened polymeric network. It is acknowledged in this respect that the term 'latent curing agent' is also referring to any agent for either one-pack or two-pack ink providing an instantaneous viscosity increase of one order of magnitude or more to fix, froze and/or immobilize the ink jet applied drop, using actinic irradiation, such as IR, visible light or UV. It is further in the scope of the present inventor wherein the term "latent curing agent" is referring to the agents themselves and/or to their various latent precursors, adapted to react at elevated temperature.

The term 'fine particles' is referring according to the present invention to any solid particles, matrices, agents or powders characterized by a maximal particle size of less than 2 microns. Preferably, yet not exclusively, the term 'fine' is referring hereinafter to nano-sized particles, having maximal particle size lower 1 micrometer, and especially to those particles having an average particle size of about 300 nanometers; e.g., particles ranging from 50 to 700 nanometers.

The present invention relates to a process of making either one-pack or two-pack inks characterized by low viscosity, high glass transition temperature (Tg) values suitable for ink jet applications in electronic manufacturing processes.

One general approach for this method is a process comprising inter alia the steps of (a) dissolving at least one solid latent curing agent characterized by fine particles in a solvent to form a clear solution; (b) admixing an inert filler having maximal particle size of 2 microns with the solution obtained above to form a homogenized dispersion; (c) precipitating said curing agent as a layer or in the form of small crystals onto said filler surface and/or inside the internal porosity of said filler; (d) evaporating said solvent; (e) drying or concentrating the same; and, (f) admixing a predetermined measure of ink composition in the manner that one-pack or two-pack ink characterized by a viscosity lower 50 Cp at application temperature, surface tension lower 80 dyn/cm at application temperature, and glass transition temperature of cured ink of greater than 120° C. is obtained.

This process has some advantages over other size reduction processes essentially including the steps of either milling or pulverizing of solid curing agents: (a) no heat buildup during size reduction is required, and deterioration or re-melting of the curative is avoided; (b) the present invention relates to wet process, so no hazardous dust nor explosion risks are provided; (c) nano-size products are available, wherein the single limit is the size of the carrier filler used in this novel process; (d) the obtained product is a ready-to-use dispersion in the manner that energy and time consuming milling is not required; (e) sophisticated product final packages are enabled: multilayer conformations; structures which enable a sequence of several curing steps, controlled release potential mechanisms and/or significant extended pot life and shelf life; (f) the obtained nano-size product is provided the cured matrix to be characterized by respectively higher Tg values, lower flammability, lower solvent and humidity permeability, improved mechanical and physical properties; and (g) a simple and cost-effective means approaching a wide processing possibilities suitable for most solid curatives.

This low viscosity thermosetting latent curing agent is especially useful for ink jet applications: It is a fine enough (usually particles that are bigger than 2 micron are forbidden) and create high Tg matrix when cures epoxy resin. The said epoxy may be selected from a resin comprising two or more oxirane groups per molecule at level of 10 to 80% (by weight) of the formula. Hence, typical epoxy resins with good trade off between viscosity and performance may be selected from the following commercially available products: DGEBA, EPN, ECN, DGEBF, cycloaliphatic epoxy, heterocyclic ring containing epoxy, phenoxy resins, hydrogenated bisphenol A/F/S type epoxy resin, dibasic acid-modified glycidyl ether type epoxy and bisphenol A based novolacs etc. It is acknowledged in this respect that at least a portion of the resin may be selected from any high Tg resins, such as polyimide, silicone resin, cyanate ester, or bismaleimides.

It is in the scope of the present invention wherein said ink composition also comprising reactive diluent, especially monoepoxides, comprising aromatic, heterocyclic, and/or cycloaliphatic at level of 2 to 20% by weight of the formula.

It is further in the scope of the present invention wherein said latent curing agents based ink also comprising impact modifiers and flexibilizers having rubbery moieties or blocks in their chain, selected in a non-limiting manner from amine/epoxy/hydroxy terminated rubber (e.g., polybutadiene, polyisoprene, hydrogenetaed polybutadiene or polyisoprene, ethylene-propylene copolymers, polydimethyl siloxane elastomer, polysulfides, polyurethanes, soft polyacrylate esters etc.) at level of 0.2 to 10% by weight of the formula.

It is further in the scope of the present invention wherein said latent curing agents comprising adhesion promoters, selected in a non-limiting manner from organometallic compounds having organo functionality (e.g., siloxane, zirconate, titanate, aluminate) at a concentration range between 0.01 to 2% by weight of the formula.

It is further in the scope of the present invention wherein said latent curing agent based ink comprising unsaturated monomers and oligomers that enables "freezing" of printed drops by exposure to actinic irradiation. The unsaturated monomers are preferably selected in a non-limiting manner from styrene, acrylic, methacrylic acid and esters thereof, acrylated or methacrylated epoxy or urethane oligomers or any mixture thereof. Said monomers are preferably at a concentration range between 1 to 25% by weight of the formula.

It is further in the scope of the present invention wherein said latent curing agent based ink comprising photoinitiators and secondary thermal initiators adapted to initiate and cure unsaturated ingredients.

It is further in the scope of the present invention wherein said latent curing agent based ink comprising amino resin such as one selected from melamine resin, urea resin, benzoguanamine resin, characterized by an impart adhesion, cross-link density, compatible with both the epoxy resins and the vinyl-containing backbone, ability to improve flame retardency of the cured film, and especially whereat its concentration is between 0.5 to 20% by weight of the formula.

It is further in the scope of the present invention wherein said latent curing agent based ink comprising mineral fillers, having maximal particle size of 2 micron, and preferably about 300 nm. Said mineral fillers are thermally and chemically inert and preferably imparts enhanced mechanical properties, chemical resistance etc. Those fillers are preferably in concentration ranges between 1 to 30% by weight of the formula.

It is further in the scope of the present invention wherein said latent curing agent based ink comprising surface active additives to control surface tension and to stabilize colloid particles, rheology modifiers, pigments and dyes, stabilizers, matting agents, solvents and co-solvents, selected in a non-limiting manner from glycol ethers (e.g., PMA, DPM, DPMA), aromatic diluents, such as toluene, and high surface tension solvents such as gamma butyro lactone or propylene carbonate.

As set forth above, the present invention also relates to a plurality of innovative and most efficient methods for producing (a) a novel latent curing agent; (b) a set of at least three novel methods for preparing ink for ink-jet printers comprising the aforementioned latent curing agent.

Hence, the general approach for the production of the latent curing agent according to the present invention is a simple process comprised inter alia of the following five steps: (a) dissolving at least one solid latent curing agent or its precursors, characterized by fine particles in a solvent to form a clear solution; (b) admixing an inert filler having maximal particle size of 2 microns with the solution obtained above to form a homogenized dispersion; (c) precipitating said curing agent as a layer or in the form of small crystals onto said filler surface and/or inside the internal porosity of said filler; (d) evaporating said solvent; and lastly, (e) drying or concentrating the same.

The method of preparing the ink is generally ended by an additional step, of admixing a predetermined measure of ink composition; in the manner that either one-pack or two-pack ink characterized by a viscosity lower 50 Cp at application temperature, surface tension lower 80 dyn/cm at application temperature, and glass transition temperature of cured ink of greater than 120° C. is obtained.

It is well acknowledged in this respect that a third approach may equally be taken, wherein the precursors of the curing agent are being admixed with the filler at the reaction medium.

Reference for that is made by U.S. Pat. No. 6,235,865 to Shimizu et al., which discloses phosphonium borate compounds useful as a curing catalyst in epoxy and other resin compositions, and U.S. Pat. No. 6,492,437 to Musa et al., which teaches for solvent-based processes for producing latent curing catalysts without causing an extreme exotherm.

Lastly, a method for producing liquid thermosetting ink for ink-jet applications, wherein the filler particles are coated in at least a significant portion of their surface with solid latent curing agents is provided. Said method comprising inter alia the step of (a) spaying at least one solid latent curing agent or its precursors, characterized by fine particles in a solvent to form a clear solution towards particles of inert filler, having maximal particle size of 2 microns with the solution obtained above to form a homogenized dispersion; and finally; and (b), admixing a predetermined measure of ink composition, in the manner that one-pack or two-pack ink characterized by a viscosity lower 50 Cp at application temperature, surface tension lower 80 dyn/cm at application temperature, and glass transition temperature of cured ink of greater than 120° C. is obtained.

EXAMPLE 1

To prepare a jettable low-viscosity, one-pack epoxy-based solder mask, the following formulation was prepared. To ensure long pot/shelf life a micronized insoluble latent curing agent DICY was used. The following ingredient where effectively admixed: 6 parts EPN (EEW=174); 24 parts DGEBF (EEW=170); 5 parts acrylated oligomers having functionality of 1 and viscosity of 5 Cp; 3 parts acrylated olygomer having functionality of 2; 3 parts of acrylated oligomer with functionality of 3; one part acrylated epoxy; 4 parts free radical photoinitiator; 9 parts $BaSO_4$ filler having particle size of 40 nm and surface area of 30 $m^2$/g; 5 parts of dispersant; 0.2 parts organic peroxide; 25 parts glycol ether solvents mixture; 2.5 parts micronized DICY having average article size of 6 microns; 8 parts of melamine formaldehyde (MF) resin; 0.5 parts of wetting agents. The formulation was milled in pearl mill to disperse the solids.

The ink utilized for the process has a viscosity of 12 Cp, and surface tension of 32.5 dyn/cm at working temperature and thus fit to ink jet application. The ink was applied by wire coater over bare copper board that was pre-cleaned and micro-etched. The film was partially hardened by UV actinic light, 120 W/cm, 0.4 sec to simulate the drop "freezing" and then at 160° C./1 hr, to achieve final properties. The cured film was proved to pass IPC SM-840 specifications, including flame retardency rating of UL 94 V0 for solder masks. When an attempt was approached to filter it before introducing into the print head, the 2 µm filter was blocked almost instantaneously. This example emphasizes the potential of the formula but calls for sub-micron DICY particles for being compatible with printer filtering and pumping system, and the printing head.

EXAMPLE 2

To enable continuous filtration, of the ink as required in industrial ink jet machines and enable introducing into the print head, a process of deposition of DICY on particles smaller than 2 µm was developed. DICY was slowly precipitated onto $BaSO_4$ fine particles from saturated organic or aqueous solution, and stabilized by rhelogy additives and dispersant. The obtained slurry was milled with epoxy resins, dispersants and solvents to form an ink precursor. The resins and dispersant keep the rheology in a state that blocks re-agglomeration and DICY crystals growth. Milling was performed in a Dyno Mill, (Bead size 0.4 mm, 2000 RPM, Retention time of about 12 minutes), until this low viscosity concentrate could be easily filtered through 2 µm glass fiber filter.

A similar system as defined in Example 1 was prepared from this ink precursor; wherein the filtration step has been significantly easy and the obtained ink could be introduced into a print head and a solder mask was printed on a bare PCB by means of a commercially available PRINTAR LGB809 printer, printing at 60° C., 100V, 2 KHz, 6 µs pulse width. The curing was identical to the one obtained in Example 1. The cured film has similar performance to the one defined in Example 1,

EXAMPLE 3

An attempt was done to lower the curing temperature by addition of curing accelerators such as Ajinomoto PN 40J Japan, and Dyhard UR200 and Dyhard UR300 from Degussa Corp. Germany.

To formulation was similar to the one defined in Example 1, wherein the curing accelerators were admixed to a level of 0.5% to 1.5%. The pot life was decreased significantly. Within 24 hrs at 50° C. the viscosity was doubled, thus make this accelerated composition impossible for high-volume ink-jet machines. Nevertheless, said pot life was determined to be very valuable in low volume applications, e.g., bonding, encapsulation, or prototype scaling in electronic manufacturing.

EXAMPLE 4

A similar process as described in Example 2, but with 5% of CTBN-epoxy adduct (i.e., EPON 58034 by Resolution Performance Products Inc. gave more flexible version that maintain the high performance properties of Example 2, and enables applications on flexible substrates or thin PCB.

EXAMPLE 5

In order to assure stable ink at storage and service, the influence of the solvent on the stability was measured as a function of the change in viscosity vs. time. The following ingredients were admixed: 6 parts of EPN (EEW=174); 24 parts of DGEBF (EEW=170); 5 parts of acrylated oligomers having functionality of 1 and viscosity of 5 Cp; 3 parts of acrylated oligomer having functionality of 2; 3 parts of acrylated oligomer with functionality of 3; one part of acrylated epoxy; 4 parts of free radical photinitiator; 5 parts of dispersant; 0.2 parts organic peroxide; 25 parts of organic solvent as described in table EX5.1; 2.5 parts of micronized DICY having average article size of 6 microns; 8 parts of melamine formaldehyde (MF) resin; and 0.5 parts of wetting agents. The formulation was homogenized in high-speed mixer to disperse the solids. The ink was exposed to 50° C. to accelerate diffusion and reactions and the stability was monitored by viscosity measured every 24 hrs. The results are summarized in the table below:

| Sample # | Solvent type | Initial viscosity (Cp) | 24 hrs Viscosity (Cp) | 48 hrs Viscosity (Cp) |
|---|---|---|---|---|
| 1 | Esterified and non esterified glycol ethers | 12.3 | 10.1 | 10.1 |
| 2 | esterified glycol ethers | 10.5 | 10.8 | 11 |

EXAMPLE 6

To prepare one-pack epoxy based legend ink for digital print of markings on PCB, having chemical resistance and long pot life, the micronized latent curing package, described in Example 2 was used. The following ingredients were affectively admixed: 6 parts EPN (EEW=174), 14 parts DGEBF (EEW=170), 3 parts $BaSO_4$, 1.5 parts DICY, 6.5 parts MF, 21 parts rutile-titanium dioxide, 1.5 parts Fumed Silica, 45 parts solvents to bring the ink to jettable viscosity. The homogenous solution was introduced into high shear (rotor/stator) mixer at 7,000 to 8,000 rpm and milled while cooled, until the pigments were dispersed, so the ink was easily filtrated through 2-micrometer filter. The viscosity of the ink at application temperature 12 cp and surface tension 32.5 dyn/cm. Dispersants and surfactants were added to stabilize the formulation.

The ink was applied onto PCB by LPG 809 printer, by PRINTA Ltd., Israel. After the print was completed the board was finally cured at 160 C/1H. The resulting marking passes the IPC specifications for legend inks on PCBs.

| Sample # | Solvent type | Initial viscosity (Cp) | 24 hrs Viscosity (Cp) | 48 hrs Viscosity (Cp) |
|---|---|---|---|---|
| 1 | Esterified and non esterified glycol ethers | 12.3 | 10.1 | 10.1 |
| 2 | esterified glycol ethers | 10.5 | 10.8 | 11 |

The invention claimed is:

1. A micron liquid thermosetting ink-jet ink, comprising:
 (a) at least one solid latent curing agent comprising an inert filler comprising barium sulfate, the inert filler being treated with a latent curing agent; said inert filler having a maximal particle size of less than 2 microns and optionally being porous; said latent curing agent being precipitated as a layer on said inert filler or being precipitated in the form of small crystals onto said inert filler surface and/or inside the internal porosity of said inert filler; and
 (b) one or more epoxy resins;

said ink-jet ink being characterized by a viscosity lower than 50 Cps at application temperature; a surface tension lower than 80 dyn/cm at application temperature; and a glass transition temperature, in the cured form, of greater than 120° C.

2. The micron liquid thermosetting ink-jet ink according to claim 1, wherein said curing agent is selected from the group consisting of modified amines, urea derivatives, imidazoles, dicyandiamide, and any mixture thereof.

3. The micron liquid thermosetting ink-jet ink according to claim 1, wherein the one or more epoxy resins are selected from the group consisting of hydrogenated bisphenol S epoxy resins, heterocyclic epoxy resins, bisphenol A epoxy resins, hydrogenated bisphenol A epoxy resins, bisphenol F epoxy resins, Novolak epoxy resins, Novolak epoxy resins of bisphenol A, and any mixture thereof.

4. The micron liquid thermosetting ink-jet ink according to claim 1, additionally comprising monomers and/or oligomers selected from styrene; acrylic or methacrylic acid and esters thereof; acrylated or methacrylated epoxies; and acrylated or methacrylated urethanes.

5. The micron liquid thermosetting ink-jet ink according to claim 1, adapted for solder mask in printed circuit boards.

6. The micron liquid thermosetting ink-jet ink according to claim 1, adapted for bonding devices or components in electronic manufacturing.

7. The liquid micron thermosetting ink-jet ink according to claim 1, adapted for printing of layers in the manufacturing of passive component capacitors and/or resistors.

8. The micron liquid thermosetting ink-jet ink according to claim 1, adapted for direct printing of conductive lines and features such as pads and/or bumps.

9. The micron liquid thermosetting ink-jet ink according to claim 1, additionally comprising impact modifiers and/or flexibilizers having rubbery moieties or blocks in their chain.

10. The micron liquid thermosetting ink-jet ink according to claim 9, wherein the impact modifiers and flexibilizers are selected from the group consisting of: amine terminated rubbers, epoxy terminated rubbers, hydroxyl terminated rubbers, and mixtures thereof; wherein said rubbers are selected from the group consisting of: polybutadiene, polyisoprene, hydrogenated polybutadiene, hydrogenated polyisoprene, ethylene-propylene copolymers, polydimethyl siloxane elastomer, polysulfides, polyurethanes, and soft polyacrylate esters.

11. The micron liquid thermosetting ink-jet ink according to claim 1, additionally comprising mineral fillers, having a maximal particle size of about 2 microns in the ink-jet ink; wherein the concentration of mineral fillers is between about 1 to 30% by weight based on the weight of the ink-jet ink.

12. The micron liquid thermosetting ink-jet ink according to claim 1, additionally comprising one or more additives selected from the group consisting of surface active agents, colloid stabilizers, rheology modifiers, pigments, dyes, matting agents, solvents, co-solvents, diluents and any mixture thereof.

* * * * *